(12) United States Patent
Wu et al.

(10) Patent No.: US 7,951,668 B2
(45) Date of Patent: May 31, 2011

(54) PROCESS FOR FABRICATING CROWN CAPACITORS OF DRAM AND CAPACITOR STRUCTURE

(75) Inventors: Kun-Jung Wu, Taoyuan County (TW); Nagai Yukihiro, Hsinchu (TW)

(73) Assignee: Powerchip Semiconductor Corp., Hsinchu (TW)

( * ) Notice: Subject to any disclaimer, the term of this patent is extended or adjusted under 35 U.S.C. 154(b) by 89 days.

(21) Appl. No.: 12/353,260

(22) Filed: Jan. 14, 2009

(65) Prior Publication Data
US 2010/0177459 A1 Jul. 15, 2010

(51) Int. Cl.
*H01L 21/8242* (2006.01)
(52) U.S. Cl. ............... 438/253; 438/396; 257/E27.084; 257/E21.646
(58) Field of Classification Search .......... 438/253–256, 438/382–399; 257/E27.084, E27.086, E27.089, 257/E21.646, E21.647, E21.648
See application file for complete search history.

(56) References Cited

U.S. PATENT DOCUMENTS

| 2007/0123031 A1* | 5/2007 | Isogai | 438/624 |
| 2008/0009119 A1* | 1/2008 | Eto | 438/386 |
| 2009/0146256 A1* | 6/2009 | Eto | 257/532 |

* cited by examiner

*Primary Examiner* — Brook Kebede
(74) *Attorney, Agent, or Firm* — Jianq Chyun IP Office

(57) ABSTRACT

A process for fabricating crown capacitors is described. A substrate having a template layer thereon is provided. A patterned support layer is formed over the template layer. A sacrifice layer is formed over the substrate covering the patterned support layer. Holes are formed through the sacrifice layer, the patterned support layer and the template layer, wherein the patterned support layer is located at a depth at which bowing of the sidewalls of the holes occurs and is bowed less than the sacrifice layer at the sidewalls. A substantially conformal conductive layer is formed over the substrate. The conductive layer is then divided into lower electrodes of the crown capacitors.

18 Claims, 5 Drawing Sheets

PROCESS FOR FABRICATING CROWN CAPACITORS OF DRAM AND CAPACITOR STRUCTURE

BACKGROUND OF THE INVENTION

1. Field of Invention

This invention relates to IC fabrication, and more particularly to a process for fabricating crown capacitors of dynamic random access memory (DRAM), and to a capacitor structure for DRAM with crown capacitors.

2. Description of Related Art

A DRAM cell typically has a MOS transistor and a capacitor coupled thereto. Current capacitor types for DRAM include crown capacitor and trench capacitor. In advanced DRAM manufacturing processes, crown capacitors are more advantageous.

FIGS. 1A-1F illustrate, in a cross-sectional view, a conventional process for fabricating crown capacitors of DRAM.

Figure 1A:
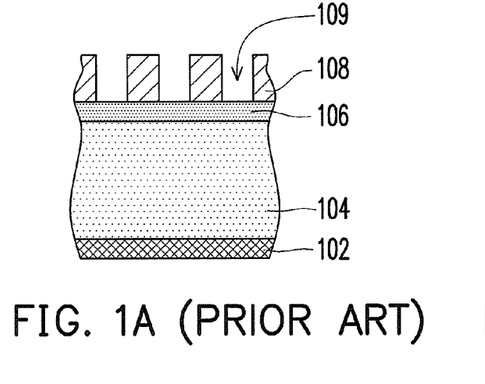
FIGS. 1A-1F illustrate, in a cross-sectional view, a conventional process for fabricating crown capacitors of DRAM.

Referring to FIG. 1A, a stacked structure of a target layer 102 formed with S/D contacts therein (not shown), a template layer 104 and a support layer 106 is provided. A patterned photoresist layer 108 is formed on the support layer 106, having therein hole patterns 109 for defining the holes serving as templates of the crown capacitors.

Figure 1B:
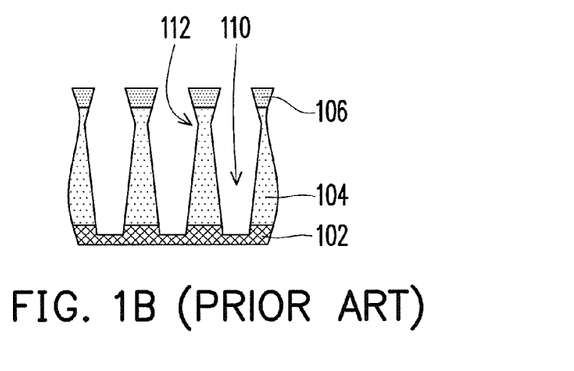

Referring to FIG. 1B, the support layer 106 and the template layer 104 are etched anisotropically using the photoresist layer 108 as a mask to form, in the template layer 104, holes 110 exposing the S/D contacts (not shown), and the photoresist layer 108 is removed. Due to inclined plasma etching in the etching process, bowing 112 occurs to the sidewall of each hole 110 at a depth within the range of about 1-6 times of the size of the hole 110 from the hole top, wherein the depth depends on the etching recipe.

Figure 1C:
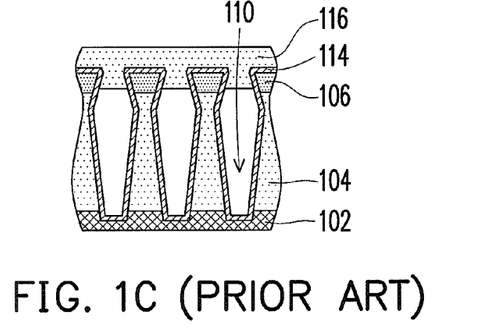

Referring to FIG. 1C, a conformal conductive layer 114 is then formed over the resulting structure, and a sealing layer 116 is formed sealing the holes 110.

Figure 1D:
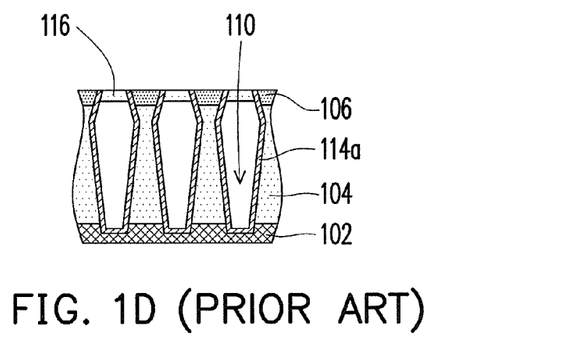

Referring to FIG. 1D, a portion of the sealing layer 116 and a portion of the conductive layer 114 on the support layer 106 are removed to expose the support layer 106, so that the conductive layer 114 is divided into lower electrodes 114a.

Figure 1E:
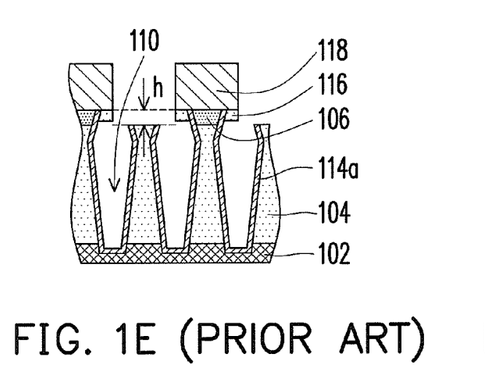

Referring to FIG. 1E, a patterned photoresist layer 118 is formed covering a part of the remaining support layer 106, and the exposed part of the same is removed to expose the template layer 104, while the exposed part of the sealing layer 116 and the exposed upper portion of each lower electrode 114a are also removed.

Figure 1F:
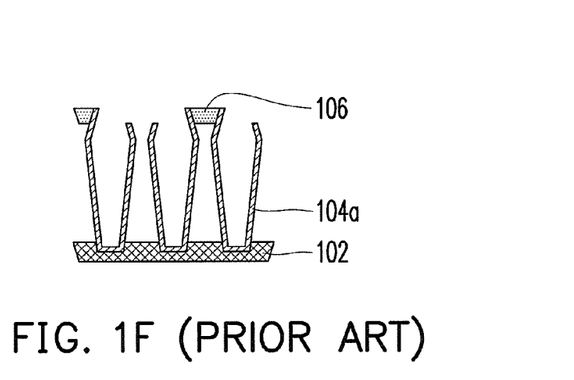

Referring to FIG. 1F, the photoresist layer 108 is removed, and the remaining sealing layer 116 and the template layer 104 are removed with wet etching. As a result, the lower electrodes 104a is supported by the support layer 106 only.

After that, a dielectric layer and the upper electrodes of the crown capacitors are formed as usual, which is well known in the art and is not shown here.

The above process is suitable in fabricating DRAM of high integration degree. However, the lower electrodes 114a are easily damaged in the etching of the support layer 106 shown in FIG. 1E, and there is a loss "h" at the upper part of each lower electrode 114a decreasing the capacitance of the capacitor formed later. Besides, when the above etching process of the support layer 106 is controlled to prevent loss at the upper part of each lower electrode 114a, the exposed portion of the upper part of each lower electrode 114a is easily broken to form undesired particles.

Moreover, when the bowing 112 of the sidewalls of the holes 110 in the template layer 104 is too much, two neighboring holes 110 are connected with each other at their sidewall bowing portions so that the two neighboring lower electrodes 114a formed in them are shorted with each other. Hence, the distance between two neighboring holes 110 is difficult to decrease, so that the lateral area of each capacitor or the integration degree of DRAM is difficult to increase.

SUMMARY OF THE INVENTION

In view of the foregoing, this invention provides a process for fabricating crown capacitors of DRAM.

This invention also provides a capacitor structure for DRAM with crown capacitors, which can be formed with the fabricating process of this invention.

The process for fabricating crown capacitors of this invention is described below. A substrate having a template layer thereon is provided. A patterned support layer is formed over the template layer. A sacrifice layer is formed over the substrate covering the patterned support layer. A plurality of holes are formed through the sacrifice layer, the patterned support layer and the template layer, wherein the patterned support layer is located at a depth at which bowing of the sidewalls of the holes occurs and is bowed less than the sacrifice layer at the sidewalls. A substantially conformal conductive layer is formed over the substrate, and the conductive layer is divided into a plurality of lower electrodes of the crown capacitors.

In an embodiment, dividing the conductive layer includes the following steps. A sealing layer is formed over the substrate to seal the holes. A portion of the sealing layer and a portion of the conductive layer are removed, possibly with dry etching or chemical mechanical polishing (CMP), to expose the sacrifice layer. The remaining sealing layer, the sacrifice layer and the template layer are removed.

In another embodiment, dividing the conductive layer includes the following steps. A sealing layer is formed over the substrate to seal the holes. The sealing layer, a portion of the conductive layer on the sacrifice layer and a portion of the sacrifice layer are removed, possibly by dry etching or CMP, to expose the support layer. The remaining sacrifice layer and the template layer are then removed.

In addition, to prevent short of neighboring lower electrodes due to bowing at the sidewalls of the holes, the sidewall bowing portions of any two neighboring holes in the sacrifice layer may be made more distant from each other by increasing the distance between the opposite top edges of the two holes not above the patterned support layer. The method of increasing the distance may include adjusting respective positions of the holes to increase the distance between the opposite top edges of any two neighboring holes not above the patterned support layer, or include shrinking the top edge of each hole not above the patterned support layer.

The capacitor structure for DRAM with crown capacitors of this invention includes a plurality of lower electrodes of the crown capacitors and a support layer. The top of each of the lower electrodes forms a closed ring in one plane. The support layer is disposed between the lower electrodes.

In an embodiment, each lower electrode has a bowing portion at its sidewall, the top of the support layer is lower than that of each lower electrode, and the support layer is disposed at the height of the bowing portion of the sidewall. In another embodiment, the top of the support layer is coplanar with that of each lower electrode.

The patterned support layer may include a plurality of parallel linear patterns or a plurality of elliptic patterns.

When the patterned support layer includes parallel linear patterns, the lower electrodes are arranged along the sides of the linear patterns.

In the process of this invention, the support layer is not selectively removed by dry etching after the conductive layer to be divided into lower electrodes is deposited. Hence, the portion of each lower electrode adjacent to the support layer can be entirely kept, without the risk of being broken to cause particles, to maintain the capacitance of each capacitor finished later. In other words, the low electrodes are lowly damaged because dry etching is not performed to the support layer after the lower electrodes are formed. Further, in an embodiment where the conductive layer is not further removed after a portion of the sealing layer and a portion of the conductive layer are removed to expose the sacrifice layer, each lower electrode is even increased in the surface area to increase the capacitance of each capacitor.

Further, the feature that the patterned support layer is located at a depth at which bowing of the sidewalls of the holes occurs and is bowed less than the sacrifice layer at the sidewalls in the hole etching process also has special effect. The distance between the two opposite edges of two neighboring hole patterns above the patterned support layer can be decreased, without connecting the corresponding two holes via the bowing portions of their opposite sidewalls in the support layer. Or, only the distance between the two opposite edges of two neighboring hole patterns not above the support layer is required to increase to avoid connection of the corresponding two holes via the bowing portions of their opposite sidewalls in the sacrifice layer. Hence, as compared with the prior art, the template holes can be formed larger to increase the capacitance without increasing the risk of short circuit, or the risk of short circuit can be decreased without decreasing the hole size and the capacitance.

In order to make the aforementioned and other objects, features and advantages of this invention comprehensible, embodiments accompanied with figures are described in detail below.

BRIEF DESCRIPTION OF THE DRAWINGS

FIG. 2B'/2C' illustrates an exemplary layout of the structure in FIG. 2B/2C, wherein the A-A' cross-section corresponds to FIG. 2B/2C.

FIGS. 2E'-2F' illustrate a later part of a process for fabricating crown capacitors of DRAM according to a second embodiment of this invention, wherein FIG. 2F' also illustrates a capacitor structure according to the second embodiment.

DESCRIPTION OF EMBODIMENTS

This invention is further described with the following embodiment, which is not intended to limit the scope of this invention. For example, the patterned support layer may include regular patterns other than the illustrated parallel linear patterns and/or the template holes may have another arrangement relative to the patterns of the patterned support layer, as long as the lower electrodes can be well supported by the support layer and the template layer between the lower electrodes can be removed without previously removing a portion of the support layer between the lower electrodes.

FIGS. 2A-2F illustrate, in a cross-sectional view, a process for fabricating crown capacitors of DRAM according to the first embodiment of this invention.

Figure 2A:
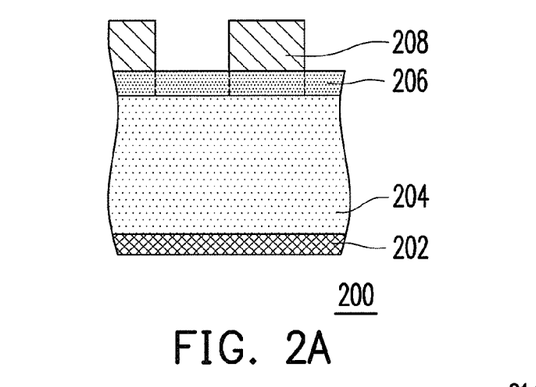
FIGS. 2A-2F illustrate, in a cross-sectional view, a process for fabricating crown capacitors of DRAM according to a first embodiment of this invention, wherein FIG. 2F also illustrates a capacitor structure according to the first embodiment.

Referring to FIG. 2A, a substrate 200 is provided, on which MOS transistors (not shown) and a target layer 202 with S/D contacts therein (not shown) have been formed. The material of the target layer 202 may be silicon nitride, silicon or metal. A template layer 204, a blanket support layer 206 and a patterned photoresist layer 208 are sequentially formed over the target layer 202. The template layer 204 may include a silicon oxide-based material, such as TEOS oxide, TEOS oxide doped with boron and phosphorus (BPTEOS) or BPSG, or include a photoresist material. The blanket support layer 206 may include silicon nitride or silicon oxynitride. The thickness of the template layer 204 is within the range of 1.0-3.0 µm, for example. The thickness of the blanket support layer 206 is within the range of 50-1000 nm, for example.

Figure 2B:
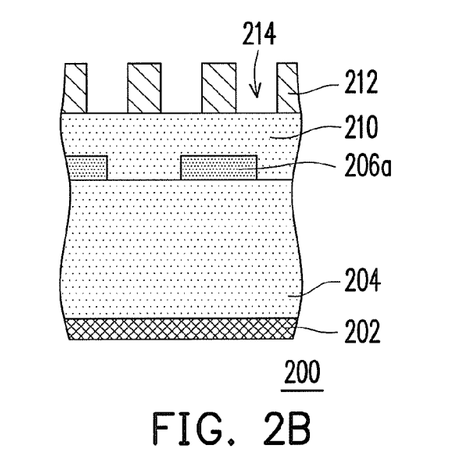

Referring to FIG. 2B, the blanket support layer 206 is etched and patterned using the patterned photoresist layer 208 as a mask, so as to form a patterned support layer 206a. The patterned support layer 206a may include a plurality of parallel linear patterns or a plurality of elliptic patterns, as explained later. After the photoresist layer 208 is removed, a sacrifice layer 210 is formed over the substrate 200 covering the patterned support layer 206a. The sacrifice layer 210 may include the same material of the template layer 204, such as silicon oxide or a polymeric material. The thickness of the sacrifice layer 210 is within the range of about 50-300 nm, and is set according to the etching recipe in forming the template holes, as explained later. Another patterned photoresist layer 212 is then formed over the sacrifice layer 210, having therein hole patterns 214 for defining the template holes for forming of the lower electrodes.

Figure 2C:
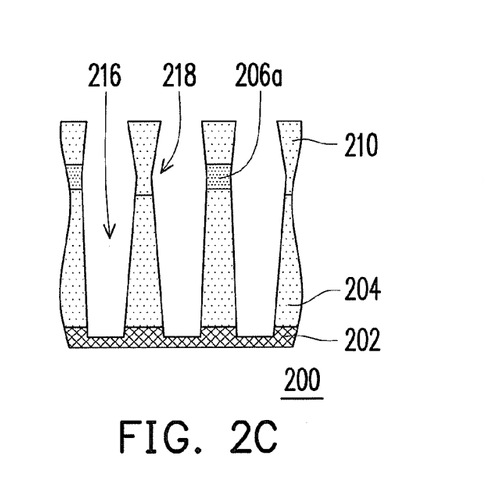

Referring to FIG. 2C, anisotropic etching is conducted with the photoresist layer 212 as a mask to form template holes 216 through the sacrifice layer 210, the patterned support layer 206a and the template layer 204. In the etching process, the patterned support layer 206a is located at the depth at which sidewall bowing 218 of the holes 216 occurs. The depth is within the range of about 1-6 times of the size of a hole 110 from the top of the hole 110, depending on the etching recipe. Accordingly, the thickness of the sacrifice layer 210 has to be adjusted according to the etching recipe such that the patterned support layer 206a is at the depth of the bowing 218 in the etching process. When the hole size is 50 nm, for example, the depth of the bowing is within the range of about 50-300 nm. At the sidewalls of the holes 216 at the depth of the bowing 218, the support layer 206a is bowed less than the sacrifice layer 210 due to its lower selectivity in the inclined plasma etching.

The structure shown in FIG. 2B/2C may have a layout as shown in FIG. 2B'/2C', wherein the A-A' cross-section corresponds to FIG. 2B/2C. Referring to FIG. 2B'/2C', the patterned support layer 206a includes a plurality of parallel linear patterns. The hole patterns 214 or holes 216 are arranged along the sides of the linear patterns, such that each hole 216 encroaches one linear pattern and has a top edge over the patterned support layer 206a and a top edge not over the same. The holes 216 arranged along the two sides of a linear pattern of the patterned support layer 206a are arranged at the two sides of the linear pattern alternately. The holes 216 arranged along the two opposite sides of two neighboring linear patterns are arranged at the two opposite sides of the two linear patterns alternately. Alternatively, the patterned support layer may include a plurality of elliptic patterns.

Figure 2D:
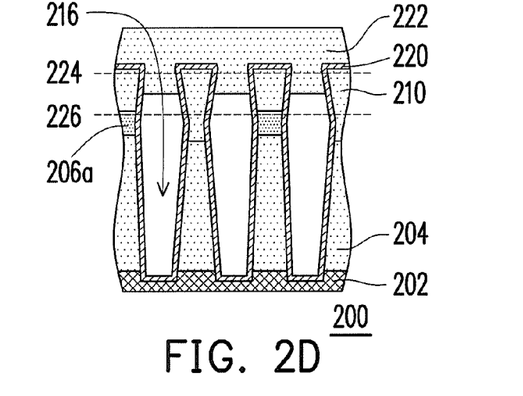

Referring to FIG. 2D, a substantially conformal conductive layer 220 is formed over the substrate 200. Specifically, the conductive layer 220 is formed on the bottoms and the sidewalls of the holes 216 and above the patterned sacrifice layer 210. The conductive layer 220 may include titanium nitride, and usually has a thickness within the range of 10-100 Å. A sealing layer 222 is then formed to seal the holes 216. The material of the sealing layer 222 may be the same as that of the template layer 204 and the sacrifice layer 210, such as silicon oxide. The thickness of the sealing layer 222 may be within the range of 30-200 nm.

Figure 2E:
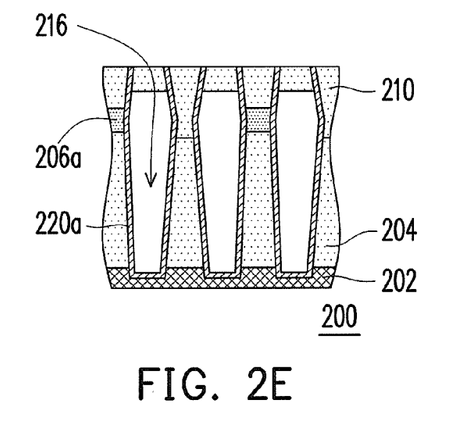

Referring to FIG. 2E, a portion of the sealing layer 222 and a portion of the conductive layer 220 above the sacrifice layer 210 are removed, possibly with CMP or dry etching, to expose the sacrifice layer 210. This is also indicated by the dash line 224 in FIG. 2D. As a result, the conductive layer 220 is divided into a plurality of lower electrodes 220a of the crown capacitors.

Figure 2F:
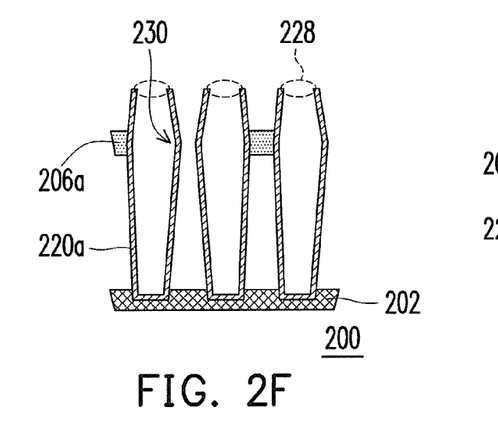

Referring to FIG. 2F, the remaining sealing layer 222, the sacrifice layer 210 and the template layer 204 are removed, preferably through wet etching. When the three layers all include silicon oxide, they can be wet-removed using an HF solution. Moreover, when the template layer 204 includes a photoresist material, it can be removed through ashing.

FIG. 2F also illustrates a capacitor structure according to the first embodiment. Since the lower electrodes 220a are formed by evenly removing a portion of the sealing layer 222 and a portion of the conductive layer 220 above the sacrifice layer 210 and no part thereof is removed then, the top of each lower electrode 220a forms a close ring 228 in one plane. Also, the sidewall of each lower electrode 220a has a bowing portion 230, which is formed due to the sidewall bowing 218 of the corresponding hole 216. The support layer 206a has a top lower than that of each lower electrode 220a, and is disposed at the height of the bowing portion 230 of the sidewall of each lower electrode 220a. As compared with the lower electrodes 114a in FIGS. 1E and 1F, each lower electrode 220a further includes a part higher than the patterned support layer 206a, so that the surface area thereof is increased increasing the capacitance.

Alternatively, the removal process for the sealing layer 222 and the conductive layer 220 above the sacrifice layer 210 may be continued down to the support layer 206a, as described in the second embodiment of this invention.

FIGS. 2E'-2F' illustrate a later part of a process for fabricating crown capacitors of DRAM according to a second embodiment of this invention. The earlier part of the process is shown in FIGS. 2A-2D and described as above.

Referring to FIG. 2E', the sealing layer 222, a portion of the conductive layer 220 on the sacrifice layer 210 and a portion of the sacrifice layer 210 are removed, possibly with CMP or dry etching, to expose the support layer 206a. This is also indicated by the dash line 226 in FIG. 2D. As a result, the conductive layer 220 is divided into a plurality of lower electrodes 220b. It is noted that the above removal process can utilize CMP so that the lower electrodes 220b are not damaged by plasma. However, as indicated by FIG. 1E, the selective removal of the support layer 106 cannot be done with CMP in the prior art.

Referring to FIG. 2F', the remaining sacrifice layer 210 and the template layer 204 are removed, preferably through wet etching. When the two layers 210 and 204 both include silicon oxide, they can be wet-removed using an HF solution.

FIG. 2F' also illustrates a capacitor structure according to the $2^{nd}$ embodiment. Since the lower electrodes 220b are removed by evenly removing the sealing layer 222, a portion of the conductive layer 220 and a portion of the sacrifice layer 210 to expose the support layer 206a and no part of each lower electrode 220b is removed then, the top of each lower electrode 220b forms a close ring 232 in one plane. Also, the top of the support layer 206a is coplanar with that of each lower electrode 220b. As compared to the electrodes 114a in FIGS. 1E-1F, no portion of the electrodes 220b beside the support layer 206a is removed, so that their surface areas are kept maintaining the capacitance.

After the conductive layer 220 is divided into the lower electrodes 220a or 220b of the crown capacitors and the sacrifice layer 210 and template layer 204 are entirely removed, a dielectric layer and an upper electrode layer can be formed with any suitable method known in the prior art, so as to finish the fabrication of the crown capacitors.

In addition, to prevent short circuit between neighboring lower electrodes 220a/b due to the sidewall bowing of the holes 216, the bowing portions of the two opposite sidewalls of any two neighboring holes 216 in the sacrifice layer 210 may be separated farther by increasing the distance between the opposite top edges of the two holes 216 not over the support layer 206a. The method of increasing the distance may include adjusting respective positions of the holes 216, or shrinking the top edge of each hole 216 not over the support layer 206a. The adjustment in the positions or shape of the holes 216 is done by modifying the design of the photomask defining the photoresist layer 212 with hole patterns 214 (FIG. 2B). Some examples are described below.

Figure 3A:
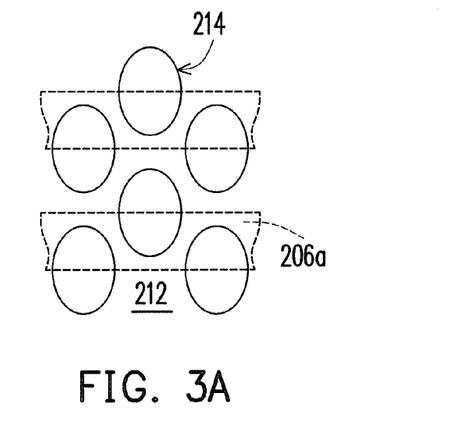
FIG. 3A illustrates an exemplary layout of the patterned support layer and the photoresist hole patterns according to the first embodiment of this invention.
Figure 3B:
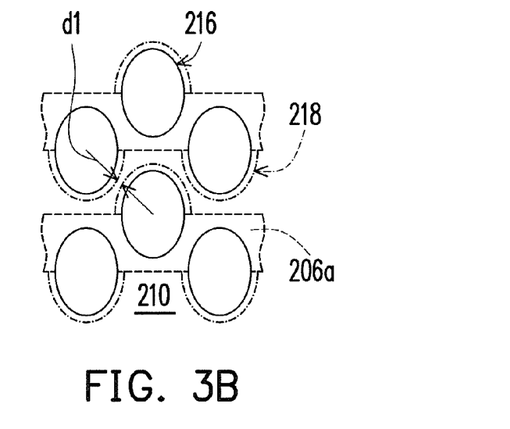
FIG. 3B illustrates the resulting layout of the patterned support layer and the template holes formed with sidewall bowing after the etching.

FIG. 3A illustrates an exemplary layout of the patterned support layer and the photoresist hole patterns according to the first embodiment of this invention, and FIG. 3B illustrates the resulting layout of the patterned support layer and the holes formed with sidewall bowing. FIG. 3A/3B is similar to FIG. 2B'/2C', wherein the distance between the bowing portions of the opposite sidewalls of any two neighboring holes 216 in the sacrifice layer 210 is indicated by "d1".

As shown in FIG. 3B, the holes 216 are arranged along two sides of each linear pattern of the patterned support layer 206a. The holes 216 arranged along the two sides of a linear pattern are arranged at the two sides of the same alternately, and those arranged along the two opposite sides of two neighboring linear patterns are arranged at the two opposite sides of the two linear patterns alternately. Hence, among the lower electrodes formed in the holes 216, those arranged along the two sides of a linear pattern of the support layer 206a are arranged at the two sides of the linear pattern alternately, and those arranged along the two opposite sides of two neighboring linear patterns are arranged at the two opposite sides of the two linear patterns alternately.

Figure 4A:
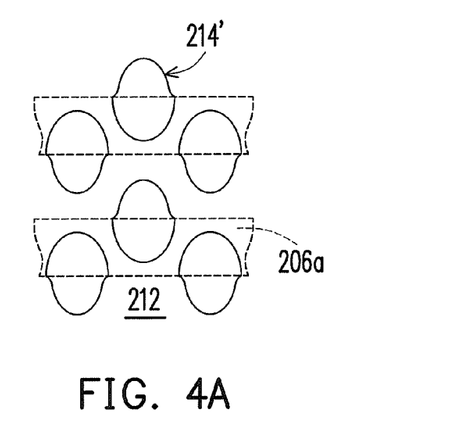
FIG. 4A/5A illustrates a first/second modification of the exemplary layout in FIG. 3A, and FIG. 4B/5B illustrates the resulting layout after the etching.
Figure 4B:
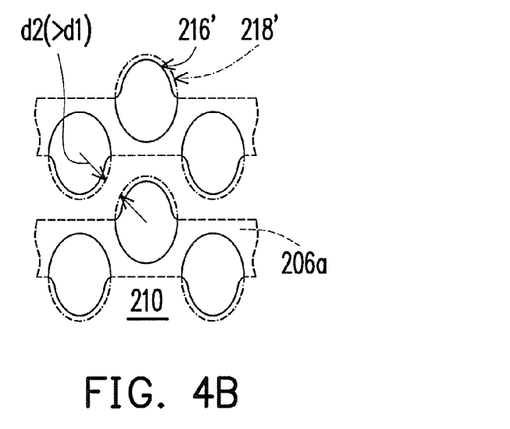

FIG. 4A/5A illustrates a first/second modification of the exemplary layout in FIG. 3A, and FIG. 4B/5B illustrates the resulting layout after the etching. The 1$^{st}$ and 2$^{nd}$ modifications are both for avoiding short circuit between neighboring lower electrodes.

Referring to FIGS. 4A & 4B, the edge of each hole pattern 214' not above the support layer 206a is shrunk, so that the top edge of each hole 216' not above the support layer 206a is shrunk increasing the distance between the opposite top edges of any two neighboring holes 216' not over the support layer 206a. Thus, the distance between the bowing portions 218' of the two opposite sidewalls of any two neighboring holes 216' in the sacrifice layer 210 is increased to d2 (>d1), and the possibility of short circuit is lowered thereby.

Figure 5A:
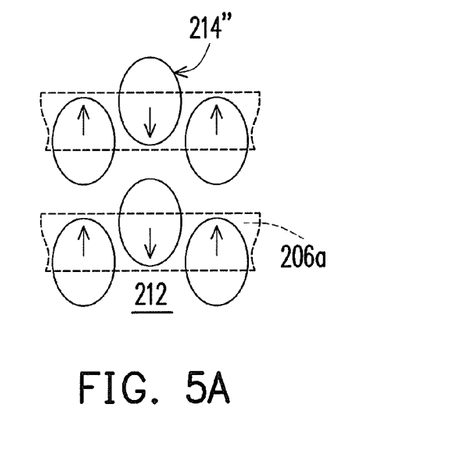
Figure 5B:
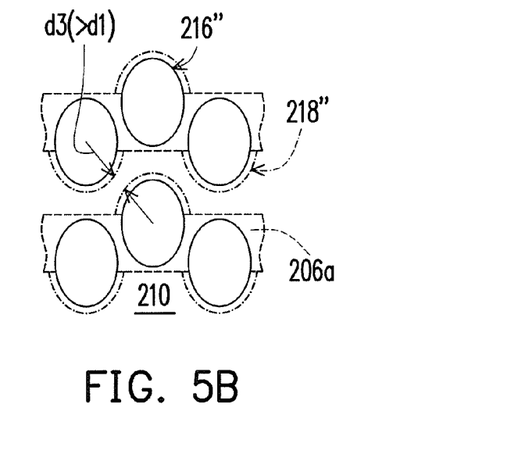

Referring to FIGS. 5A & 5B, each hole pattern 214" above the first side of a linear pattern of the patterned support layer 206a is shifted toward the second side of the same and each hole pattern 214" above the second side of a linear pattern shifted toward the first side of the same, so that the distance between the opposite top edges of any two neighboring holes 216" above the support layer 206a is decreased but that between the opposite top edges of any two neighboring holes 216" not above the support layer 206a is increased. Thus, the distance between the bowing portions 218" of the opposite sidewalls of any two neighboring holes 216" in the sacrifice layer 210 is increased to d3 (>d1), and the possibility of short circuit is lowered thereby.

Figure 6A:
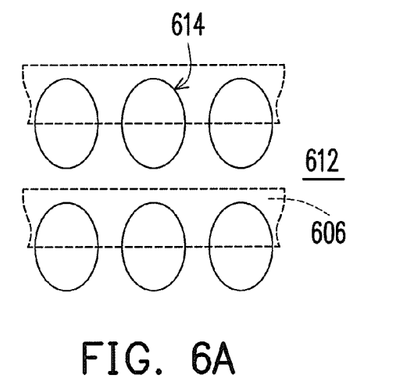
FIG. 6A illustrates an exemplary layout of the patterned support layer and the photoresist hole patterns according to a third embodiment of this invention.
Figure 6B:
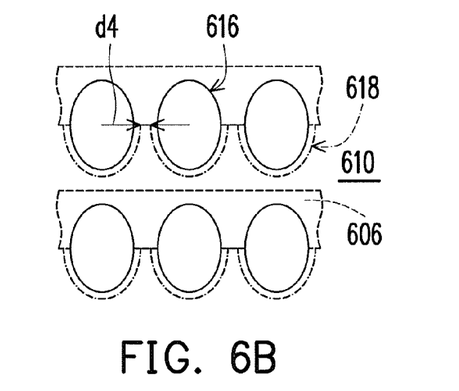
FIG. 6B illustrates the resulting layout of the patterned support layer and the holes formed with sidewall bowing after the etching.

FIG. 6A illustrates an exemplary layout of the patterned support layer and the photoresist hole patterns according to a third embodiment of this invention, and FIG. 6B illustrates the resulting layout of the patterned support layer and the holes formed with sidewall bowing after the etching.

In the third embodiment, the patterned support layer 606 also includes a plurality of parallel linear patterns, while the hole patterns 614 or holes 616 are arranged along first sides of the linear patterns but not along second sides of the same. The distance between the bowing portions 618 of the two opposite sidewalls of any two neighboring holes 616 in the sacrifice layer 610 is indicated by "d4". Since the holes 616 are arranged along the first sides of the linear patterns of the support layer 606 but not along the second sides, the lower electrodes (not shown) formed in the holes 616 are also arranged along the first sides of the linear patterns but not along the second sides.

Figure 7A:
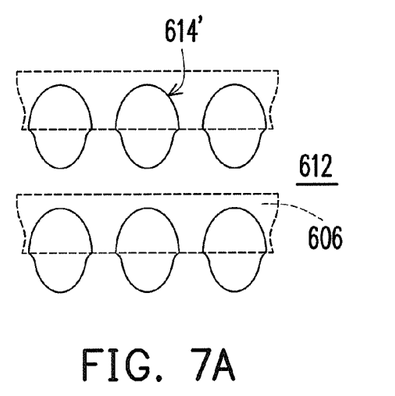
FIG. 7A/8A illustrates a first/second modification of the exemplary layout in FIG. 6A, and FIG. 7B/8B illustrates the resulting layout after the etching.
Figure 7B:
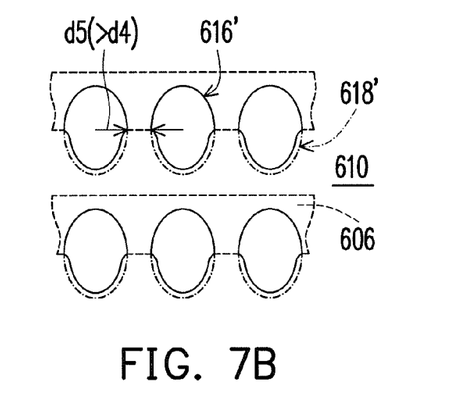

FIG. 7A/8A illustrates a first/second modification of the exemplary layout in FIG. 6A, and FIG. 7B/8B illustrates the resulting layout after the etching. The 1$^{st}$ and 2$^{nd}$ modifications are both for avoiding short circuit between neighboring lower electrodes.

Referring to FIGS. 7A & 7B, the edge of each hole pattern 614' not above the support layer 606 is shrunk, so that the top edge of each hole 616' not above the support layer 606 is shrunk increasing the distance between the opposite top edges of any two neighboring holes 616' not above the support layer 606. Thus, the distance between the bowing portions 618' of the opposite sidewalls of any two neighboring holes 616' in the sacrifice layer 610 is increased to d5 (>d4), and the possibility of short circuit is lowered thereby.

Figure 8A:
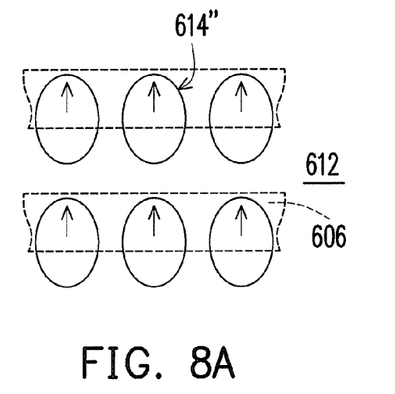
Figure 8B:
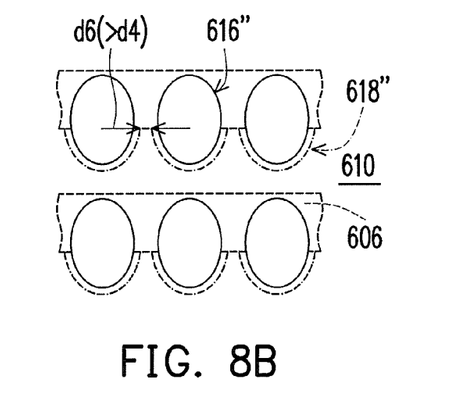

Referring to FIGS. 8A & 8B, each hole pattern 614" above the first side of a linear pattern of the patterned support layer 606 is shift toward the second side of the same, so that the distance between the opposite top edges of any two neighboring holes 616" above the patterned support layer 606 is decreased but that between the opposite top edges of any two neighboring holes 616" not above the patterned support layer 606 is increased. Thus, the distance between the bowing portions 618" of the two opposite sidewalls of any two neighboring holes 616" in the sacrifice layer 610 is increased to d6 (>d4), and the possibility of short circuit is lowered thereby.

This invention has been disclosed above in the preferred embodiments, but is not limited to those. It is known to persons skilled in the art that some modifications and innovations may be made without departing from the spirit and scope of this invention. Hence, the scope of this invention should be defined by the following claims.

What is claimed is:

1. A process for fabricating crown capacitors of DRAM, comprising:
   providing a substrate having a template layer thereon;
   forming a patterned support layer over the template layer;
   forming a sacrifice layer over the substrate covering the patterned support layer;
   forming a plurality of holes through the sacrifice layer, the patterned support layer and the template layer, wherein the patterned support layer is located at a depth at which bowing of sidewalls of the holes occurs and is bowed less than the sacrifice layer at the sidewalls;
   forming, a substantially conformal conductive layer over the substrate; and
   dividing the conductive layer into a plurality of lower electrodes of the crown capacitors.

2. The process of claim 1, wherein the step of dividing the conductive layer into the lower electrodes comprises:
   forming a sealing layer over the substrate to seal the holes;
   removing a portion of the sealing layer and a portion of the conductive layer to expose the sacrifice layer; and
   removing the remaining sealing layer, the sacrifice layer and the template layer.

3. The process of claim 2, wherein the step of removing a portion of the sealing layer and a portion of the conductive layer comprises a dry etching step.

4. The process of claim 2, wherein the step of removing a portion of the sealing layer and a portion of the conductive layer comprises a CMP step.

5. The process of claim 2, wherein the step of removing the remaining sealing layer, the sacrifice layer and the template layer comprises a wet etching step.

6. The process of claim 1, wherein the step of dividing the conductive layer into the lower electrodes comprises:
   forming a sealing layer over the substrate to seal the holes;
   removing the sealing layer, a portion of the conductive layer on the sacrifice layer and a portion of the sacrifice layer to expose the support layer; and
   removing the remaining sacrifice layer and the template layer.

7. The process of claim 6, wherein the step of removing the sealing layer, a portion of the conductive layer on the sacrifice layer and a portion of the sacrifice layer comprises a dry etching step.

8. The process of claim 6, wherein the step of removing the sealing layer, a portion of the conductive layer on the sacrifice layer and a portion of the sacrifice layer comprises a CMP step.

9. The process of claim 6, wherein the step of removing the remaining sacrifice layer and the template layer comprises a wet etching step.

10. The process of claim 1, wherein the step of forming the patterned support layer over the template layer comprises:
    forming a blanket support layer over the template layer; and
    patterning the blanket support layer by etching.

11. The process of claim 1, further comprising adjusting respective positions of the holes to increase a distance between two opposite top edges of any two neighboring holes not above the patterned support layer.

12. The process of claim 11, wherein
the patterned support layer comprises a plurality of parallel linear patterns,
the holes are arranged along first sides of the linear patterns, and
adjusting respective positions of the holes comprises shifting each hole toward a second side of the corresponding linear pattern.

13. The process of claim 11, wherein
the patterned support layer comprises a plurality of parallel linear patterns,
the holes are arranged along two sides of each linear pattern,
the holes arranged along two sides of a linear pattern are arranged at the two sides of the linear pattern alternately,
the holes arranged along two opposite sides of two neighboring linear patterns are arranged at the two opposite sides of the two linear patterns alternatively, and
adjusting respective positions of the holes comprises shifting each hole at a first side of a linear pattern toward a second side of the linear pattern and shifting each hole at the second side of a linear pattern toward the first side of the linear pattern.

14. The process of claim 1, further comprising shrinking a top edge of each hole not above the patterned support layer to increase a distance between opposite top edges of any two neighboring holes not over the patterned support layer.

15. A capacitor structure for DRAM with crown capacitors, comprising:
a plurality of lower electrodes of the crown capacitors disposed on a substrate, wherein a top of each of the lower electrodes forms a closed ring in one plane; and
a support layer disposed between the lower electrodes and at a height of upper portions of the lower electrodes, with an empty space between the support layer and the substrate,
wherein each of the lower electrodes has a bowing portion at a sidewall thereof, a top of the support layer is lower than the top of each of the lower electrodes, and the support layer is disposed at a height of the bowing portion of the sidewall.

16. The capacitor structure of claim 15, wherein the support layer comprises a plurality of parallel linear patterns or a plurality of elliptic patterns.

17. The capacitor structure of claim 16, wherein
the support layer comprises a plurality of parallel linear patterns,
the lower electrodes are arranged along two sides of each linear pattern,
the lower electrodes arranged along two sides of a linear pattern are arranged at the two sides of the linear pattern alternately, and
the lower electrodes arranged along two opposite sides of any two neighboring linear patterns are arranged at the two opposite sides of the two linear patterns alternatively.

18. The capacitor structure of claim 16, wherein
the support layer comprises a plurality of parallel linear patterns, and
the lower electrodes are arranged along first sides of the linear patterns but not along second sides of the linear patterns.

* * * * *